United States Patent
Caprio et al.

(10) Patent No.: US 12,135,347 B2
(45) Date of Patent: Nov. 5, 2024

(54) METHOD FOR DETECTING AND ADJUSTING POOR BACK DRILLS IN PRINTED CIRCUIT BOARDS

(71) Applicant: R&D Circuits, South Plainfield, NJ (US)

(72) Inventors: Michael Caprio, Monroe Township, NJ (US); Dwarkesh Patel, Piscataway, NJ (US); Hiren Patel, Hillsborough, NJ (US); Yubing Wang, Pennington, NJ (US); Donald Eric Thompson, Fremont, CA (US)

(73) Assignee: R&D Circuits, South Plainfield, NJ (US)

( * ) Notice: Subject to any disclaimer, the term of this patent is extended or adjusted under 35 U.S.C. 154(b) by 0 days.

(21) Appl. No.: 17/381,757

(22) Filed: Jul. 21, 2021

(65) Prior Publication Data
US 2023/0026067 A1    Jan. 26, 2023

(51) Int. Cl.
| | |
|---|---|
| *G01R 31/28* | (2006.01) |
| *H05K 3/00* | (2006.01) |
| *H05K 3/42* | (2006.01) |
| *H05K 1/02* | (2006.01) |
| *H05K 1/11* | (2006.01) |

(52) U.S. Cl.
CPC ..... *G01R 31/2805* (2013.01); *G01R 31/2812* (2013.01); *H05K 3/0047* (2013.01); *H05K 3/429* (2013.01); *H05K 1/0268* (2013.01); *H05K 1/115* (2013.01); *H05K 2203/0207* (2013.01); *H05K 2203/163* (2013.01)

(58) Field of Classification Search
CPC ............... G01R 31/2805; G01R 31/28; G01R 31/2812; H05K 3/0047; H05K 3/00; H05K 3/429; H05K 3/42; H05K 1/0268; H05K 1/02; H05K 1/115; H05K 1/11; H05K 2203/0207; H05K 2203/163
See application file for complete search history.

(56) References Cited

U.S. PATENT DOCUMENTS

| | | | |
|---|---|---|---|
| 8,222,537 B2 | 7/2012 | Dudnikov, Jr. et al. | |
| 8,431,834 B2 | 4/2013 | Twardy et al. | |

(Continued)

FOREIGN PATENT DOCUMENTS

| | | | | |
|---|---|---|---|---|
| CN | 105430913 A | * | 3/2016 | .......... H05K 3/0047 |
| CN | 108260291 | | 7/2018 | |

(Continued)

OTHER PUBLICATIONS

Belford et al., 1B.2: Making Measurements: Experimental Error, Accuracy, Precision, Standard Deviation and Significant Figures, LibreTexts, https://chem.libretexts.org (Year: 2016).*

*Primary Examiner* — Tarun Sinha

(57) ABSTRACT

The present invention provides a method for detecting and adjusting failed back-drills in PCBs in the process of fabricating a PCB so that the failed back-drill can be screened out or repaired. This is accomplished, by after detecting poor back drills in a PCB, measuring the actual thickness of each PCB board. Next, the measured actual thickness of each PCB board is compared with .the theoretical thickness of each PCB board. The back drill depth for each area of the PCB board is then adjusted for its theoretical thickness and percent variation from the measured thickness to adjust the poor back drill.

19 Claims, 7 Drawing Sheets

(56) References Cited

U.S. PATENT DOCUMENTS

2010/0314163 A1 12/2010 Twardy et al.
2021/0014979 A1* 1/2021 Adler .................. H05K 3/4038

FOREIGN PATENT DOCUMENTS

| CN | 109843000 | | 6/2019 | | |
|----|-----------|---|--------|---|--------------|
| CN | 113079640 | A * | 7/2021 | ........... | H05K 3/0005 |
| EP | 2420115 | B1 * | 4/2015 | ........... | H05K 1/0268 |

* cited by examiner

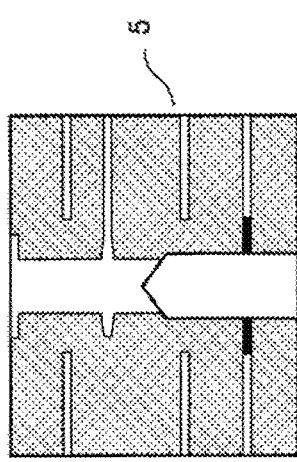
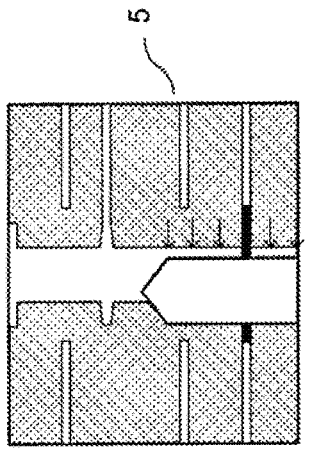
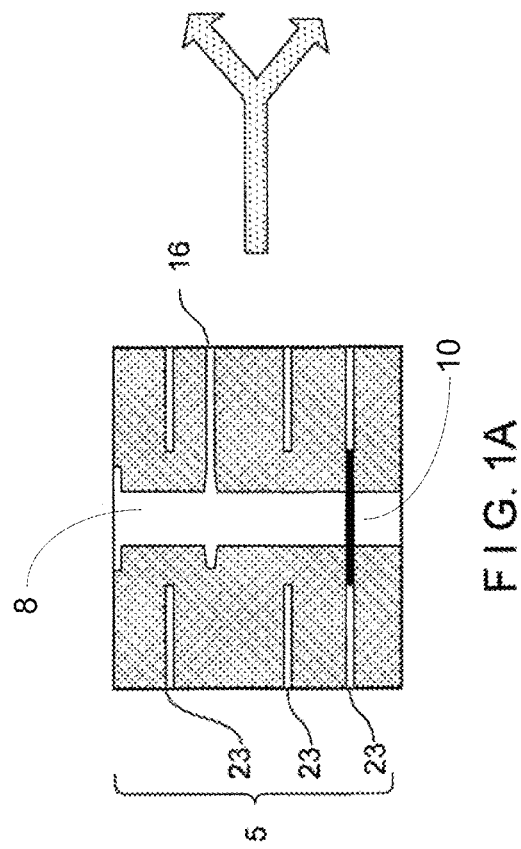

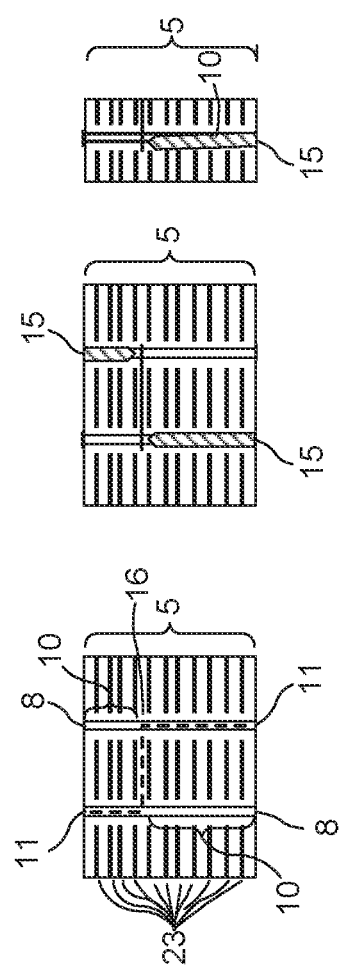
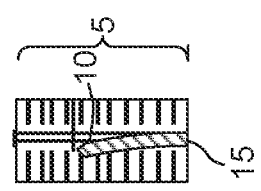
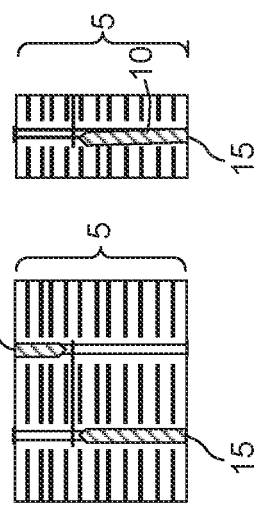
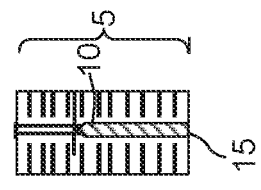
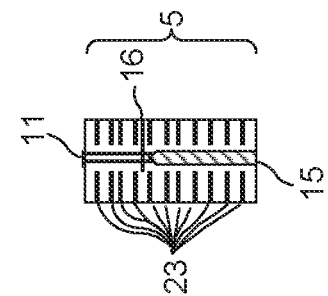
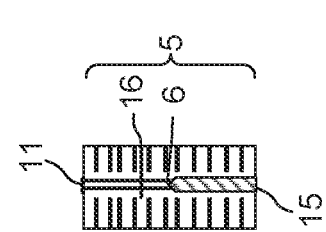
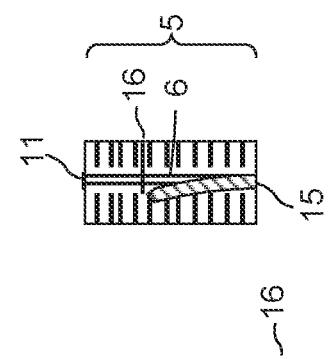
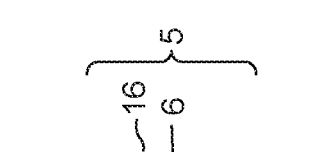
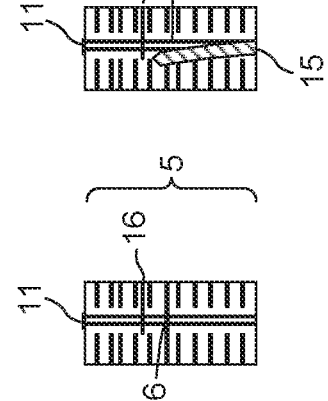

METHOD FOR DETECTING AND ADJUSTING POOR BACK DRILLS IN PRINTED CIRCUIT BOARDS

RELATED APPLICATIONS

The present application is a continuation in part of pending patent application Ser. No. 17/173,441 filed on Feb. 11, 2021 by assignee to applicant R&D Circuits and claims priority thereunder.

BACKGROUND

1. Field

The present invention relates to back drilling in printed circuit boards (PCBs). In particular the present invention relates to detecting poor or failed back-drills in printed circuit boards.

Back-drills are a common industry technique for removing the "stubs" of vias in PCBs to improve high speed signal performance. It is well understood in the industry that a stub will reduce the maximum speed of a signal traversing a trace and via transmission line. Many techniques are commonly used to remove the via stubs from designs including multi-lamination construction, laser vias, back-drills, and strategic layer placement.

For high layer count PCBs greater than ~16 layers the back-drill solution is preferred solution due to its flexibility and economics. Back-drills can be programmed with different drill depth depending on the location of the specific signal layer. Back-drills can be performed from both top and bottom sides of the board and only the high speed signal vias are typically back-drilled.

A back-drill is the process of drilling out a portion of the metalized vias to improve the high-speed performance of the transmission line. The back-drill vias can be left open or can be filled in later PCB process steps but the conductive path is removed.

A failed back-drill in a PCB is one that does not remove all of the metal in the drilled hole or via. This can be due to any of a variety of reasons during the PCB fabrication process such as a drill-misalignment, board thickness variation etc. FIG. 1 Illustrates drill misalignment. A failed drill-back will leave a conductive path of some or all of the length of the drilled via. The via stub created by the failed drill-back results in a degradation of high frequency signals in that path in the PCB.

1. The Related Prior Art

Common PCB testing is accomplished by measuring opens and shorts by employing a flying-probe test. However, these testers are not able to detect a failed back-drill. It is necessary to utilize high-speed test tools such as a Vector Network Analyzer or a Time Domain Reflectometer in order to see the failed back-drill but these tools are expensive, difficult to implement in scale and produce difficult to analyze results. Visual inspection has a limited success rate of detecting back-drill problems and 3 D X-rays machines are both expensive and unreliable.

The current industry standards for the acceptable stub in a high-speed signal for a back-drill is 15 mils (±5 mils) or 10 mils (±5 mils). High frequency signals are more common and we see increased signal speeds that require smaller stubs, such as 5 mils (±3 mils). There is a need for improved back-drill tolerances.

Back Drill Challenges—Board Thickness Variation

Besides the requirement to keep tightening the stub length tolerance, board thickness variation also poses another challenge to perform accurate back drill. This is because back-drills are typically calculated and programmed based on theoretical thickness of panel stack up and where the signal layers are (determine how deep back drills need to go). FIG. 5 shows an example of the panel stack up thickness and theoretical back drill depth In reality, even same design boards pressed in the same batch could have a few mils difference in average thickness from board to board. The thickness variation from area to area within a board could be even bigger.

There are many factors that can cause board thickness to vary, such as layer to layer copper balance, copper density variation within a layer, core thickness distribution, press cycle and press platen flatness etc. Generally, the thicker the board is, the more thickness variation is. For example, for an around 60-layer count and around 300 mil thick board design, after press there could be 15-20 mils thickness variation between the thinnest area and the thickest area within a same board. Depends on the depth of the back drills, part of the 15-20 mil variation in panel thickness would be transferred to stub length variation in traditional back drill methods. FIG. 6 shows a board with thick area and thin area (due to density of copper).

In most cases, same back drill parameters are applied to the same design boards. Even if there is thickness variation across the boards or within a board, the traditional back drill technology does not take that into account. As a result, the thick area often has a longer back drill stub length, while the thin area often ends up with a shorter back drill length, as seen in FIG. 7

SUMMARY

It would therefore be advantageous to have a novel method for detecting failed or poor back-drills in PCBs that avoids the drawbacks of the aforementioned prior art proposals.

The present invention provides a method for detecting failed back-drills in PCBs early in the process of fabricating a PCB so that the failed back-drill can be screened out or repaired.

The present invention accomplishes this by adding a short to ground connection near the signal layer for every back-drill. This short to ground connection is cut by a successful back-drill. If the back-drill is bad or failed it will leave the connection to ground and fail the electrical test with a short to ground being detected. The PCB can be repaired by re-drilling the hole or Solution to address board thickness variation.

In order to deliver consistent back drill stub to achieve high speed signal performance, the present invention also disclose a novel technology for detecting board thickness variation in early stage and overcome the thickness variation for each individual board and even each individual back drill hole within a board.

This technique includes 2 steps. The first step is to map out each board actual thickness. This can be accomplished through a thickness measurement gauge (such as caliper gage, micrometer caliper, dial thickness gauge, electronic measuring gauge, laser or optical measuring gauge, etc.). In general, this tool has two aligned touch pins or optical/laser points, one touch or focused on top of the panel and the other touch or focused on bottom of the panel. To conduct thickness measurement, a panel is divided into dozens or hundreds of small zones. Then thickness of each individual zone of in entire panel is measured and recorded accordingly. This measurement approach also takes away the impact of bow and twist, so that true thickness of the board is measured. Depending on board size, the measurements could range from a few to a few hundreds in order to map the board thickness (or backdrill area thickness). The FIGS. 8 A and 8 B show the measurement tool 50 and the mapped chart, respectively illustrating a board with a few measured thickness at the 4 corners and the center.

After the true thickness of each zone of the entire board is mapped out, the percent variation of each measured zone is calculated by comparing the true thickness versus theoretical thickness. Then back drill depth in each area is then adjusted accordingly based on the theoretical depth and the percent variation. For example, if a board has the theoretical thickness of 200 mil, and actual thickness of one specified zone is measured as 220 mil. Then variation is 110%. Therefore, if the original theoretical back drill depth is 100 mil, and it would be increased by 10% more to go actually 110 mil. All back drills in the entire board are adjusted through the same approach accordingly. With this approach, consistent back drill stubs are achieved. Hence, high speed performance (relates to back drill holes) are guaranteed.

FIG. 9 demonstrates a thin spot with an adjusted back drill depth and resulted in a same back drill stub of hole 1

BRIEF DESCRIPTION OF THE DRAWINGS

FIG. 1 A shows the placement of the short to ground near a signal layer of the PC;

FIG. 1 B shows a good back-drill in a PCB;

FIG. 1 C shows a bad back-drill in a PCB;

FIG. 2 A shows the selected, configured or design PCB with a transmission line consisting of a via, a signal trace, another a via, and two stubs before back-drilling FIG. 2 B shows shorting the signal trace to ground in a hole or a via of the PCB;

FIG. 2 C shows a bad back-drill failure due to drill shift;

FIG. 2 D shows a bad back-drill failure due to drill wander;

FIG. 2 E shows a bad back-drill failure due to shallow drill;

FIG. 2 F shows one example of electrical connection to ground failure;

FIG. 2 G shows another example of electrical connection to ground failure;

FIG. 2 H shows another example of electrical connection to ground failure;

FIG. 2 I illustrates a back-drill cutting an electrical connection to a power plane;

FIG. 2 J shows two back-drills that removed two via stubs;

FIG. 3 illustrates the methodology of the present invention in which FIG. 3 shows one method of how the present invention can be automated in the PCB design process and integrated with manufacturing the PCB 5 for opens and shorts to determine if, among other things, all of the back-drills removed all of the short to ground connections;

FIG. 4 B shows a PCB with a via after back drill and leaves a stub (the FIG. 4B needs to corrected as below);

DETAILED DESCRIPTION OF THE PREFERRED EMBODIMENTS

Figure 3:
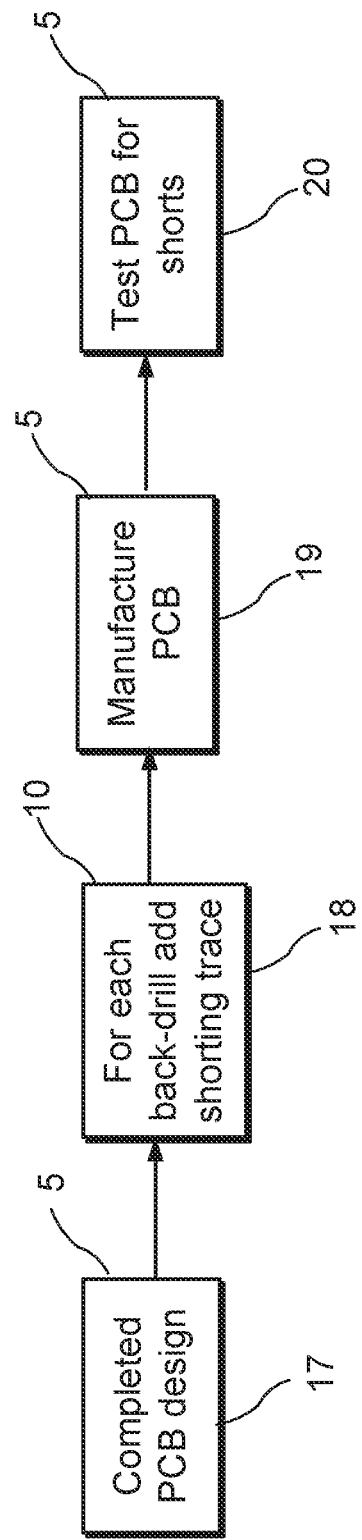

The referenced elements for the present invention include:
1. PCB 5. (FIG. is replaced, see separately attached)
2. Via or hole 8. (hole that does not need to be back drilled)
3. Shorting trace or stub 10
4. Signal level or trace or stripline 16
5. Back-drill 15.
6. Ground/power plane 23.
7. Transmission line or signal path 11.
8. PCB thick area 5a.
9. PCB thin area 5b.
10. Measuring tools 50

Referring now to the drawings, FIG. 1A, in accordance with the teachings of the present invention illustrates the methodology of the present invention wherein in the PCB design a short to ground connection 10 (hereinafter referred to as a shorting trace 10) is added into the design a programmed distance from the signal trace 16 that electrically connects or shorts the signal via 8 to ground. Thus there is a placement of the shorting trace 10 near a signal trace 16 of the PCB 5. Therefore if, for example, a 10 mil±5 mils back-drill 15 is drilled in a hole or via 8 of the PCB 5, the shorting trace 10 is placed on the first ground layer 16 mils past the signal trace or strip line 16. When a successful back-drill operation is performed the back-drill 15 breaks the electrical connection between signal trace 16 and ground. If the back-drill 15 fails it will leave a path of conductive material in the signal via 8 that will still short signal trace 16 to ground 10 at that sign at that signal trace 16. A failed back-drill is illustrated in FIGS. 2 H, 2 G and 2 I.A good back-drill is shown FIG. 1 B FIG. 2 J.

FIG. 2 A shows a PCB with transmission line path 11 from top left to bottom right. The transmission line is a via 8, a trace or stripline 16, and a via 8. Via stubs 10 are also present In FIG. 2 B, a shorting trace 6 is connecting the via 8

FIGS. 2 C-2 E show common back-drill failure modes. FIG. 2 C shows a back-drill failure due to drill shift. FIG. 2 E shows a bad back-drill failure due to drill wander. Drill wander is when a drill does not drill straight down into the PCB 5 but instead curves away from a straight up or down path FIG. 2 F shows a back-drill failure due to shallow drill. A shallow drill is one that leaves a stub 10 longer than the maximum stub length allowed.

FIGS. 2 F, 2 G and 2 H show common back-drill failure modes with a shorting trace 10 connecting signal 11 to ground and, as seen in in FIGS. 2 F and 2 G, not connecting with the signal level of stripline 16. FIG. 2 I shows a back-drill 15 that cuts the shorting trace signal to ground or power plane 23 connection. FIG. 2 J shows a PCB 5 with back-drill 15 that removed the via stubs 8.

FIG. 3 illustrates the methodology of the present invention. In FIG. 3 illustrates a first step of the methodology of the present invention in which a design or configured PCB 5 is selected. Next, FIG. 3 shows a second step 18 in which shorting traces 10 are added to back-drilled vias 8 in the PCB 5 design.

FIG. 3 illustrates a third step of the methodology in which the PCB 5 is designed 17 and subsequently the electronic design files are modified using automated software 18 to add shorting traces for each back-drilled via. The PCB 5 is then manufactured 19 using common PCB manufacturing techniques. It is then tested 20 to verify each transmission line 11 is electrically isolated from ground 23 to confirm the back-drill 15 cut the shorting trace confirming a good back-drill. If there is a short then the back-drill 15 has failed and the PCB 5 must be discarded or repaired.

The methodology of the claimed invention is preferably software implemented in the following steps:
1. Execute the program and select the design files
2. There are three sections
   Back Drill
   Compare IPC
   Compare Shorts
3. The first section "Back Drill" will update all back drill vias to create intentional short to ground
4. The second section "Compare IPC" will compare the board files before and after intentional short to verify correct functionality
5. The third section "Compare Shorts" compares the error checking output files to the expected errors that are generated from this software. The shorting of a signal via to ground will create a DRC error that other computer aided manufacturing software will detect. CAM 350 is an example of Gerber Computer Aided Manufacturing tool that will detect said errors. This section will make sure that other unrelated errors are separated from errors caused by this process B. Back-Drill Program Details
1. User implements the following parameters:
   a. Via stub length: This value is the minimum stub length before a short can be added (E.g. 10 mils)
   b. Ground net: This is the name of the ground net in the PCB design software. (E.g. "VSS")
   c. Copper Web: This value is the copper web in the custom antipad allowing ground copper to flow in the back drill vias by default the tool will use a value of 5 mils.
   d. Copper Diameter: This is the copper diameter around the hole.

Program Steps Include:
2. Execute program:
   a. Load PCB design file
   b. Loop through all back drilled via locations
   c. Start at trace depth, define this as position 0
   d. Subtract "via stub length" from this position 0 (E.G. 0-10=-10)
   e. Start at this calculated position and look for closest "Ground net" copper plane while moving away from the trace location. (E.G. "VSS layer located at −16.5 mils")
   f. Add shorting feature defined by "Ground Web" and "Copper Diameter" (E.G. see picture)
   g. Rename design file via name to customer name indicating anti-pad modification. <image.png>
   h. Create report file indicating changes made The methodology of the present invention is assisted from tools improvements in a typical PCB design flow. All common PCB design tools have a design rule check, also known as DRC that looks for nets that are shorted together as well as other error checking. A program or script adds the shorting trace or stub 10 at all back-drill 15 locations and adjusts the depth of the shorting trace 10 by the tolerance of the back-drill 15 and the depth of the signal trace 6 to produce a back drill stub 10 of approximately consistent length for each said PCB Board having a tight tolerance for high speed signal applications. The back drill stub 10 produced is approximately a same length (0.1 mil to 2 mil optimum and preferably from 2 mil to 5 mil for each said PCB Board having a tolerance range of optimum plus/minus 1 mil and preferred is plus/minus 3 mil for high speed signal applications in a range of 30 to 100 GHZ optimal and preferably 30 to 70 GHZ.

Once the shorting traces 10 are added the common PCB design or Gerber files then computer added manufacturing, A.K.A. CAM, tools will show DRC errors. The back-drill shorting trace 10 DRC flags must be identified and screened out so DRC flags for legitimate errors are caught and fixed. It is understood that although copper web is preferably used any suitable electrically conductive metallic material can be used.

Figure 4A:
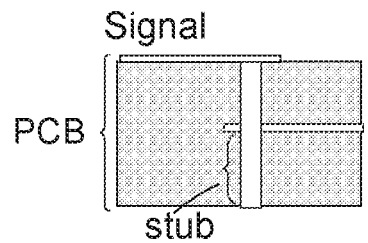
FIG. 4 A shows a PCB with a metalized hole that needs to be back drilled.

The present invention then proceeds to correct detected poor back-drills in each of the PCB boards 5 as shown in FIGS. 4A-10. FIG. 4A shows a PCB 5 with a via 8 and a stub 10 that needs to be back drilled.

Figure 4B:
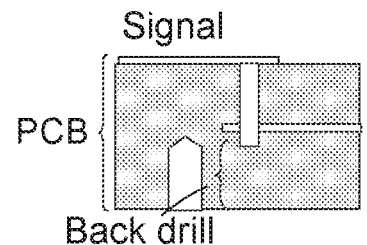

FIG. 4B shows a PCB 5 with a via, a back drill and a shortened stub after back drill.

Figure 5:
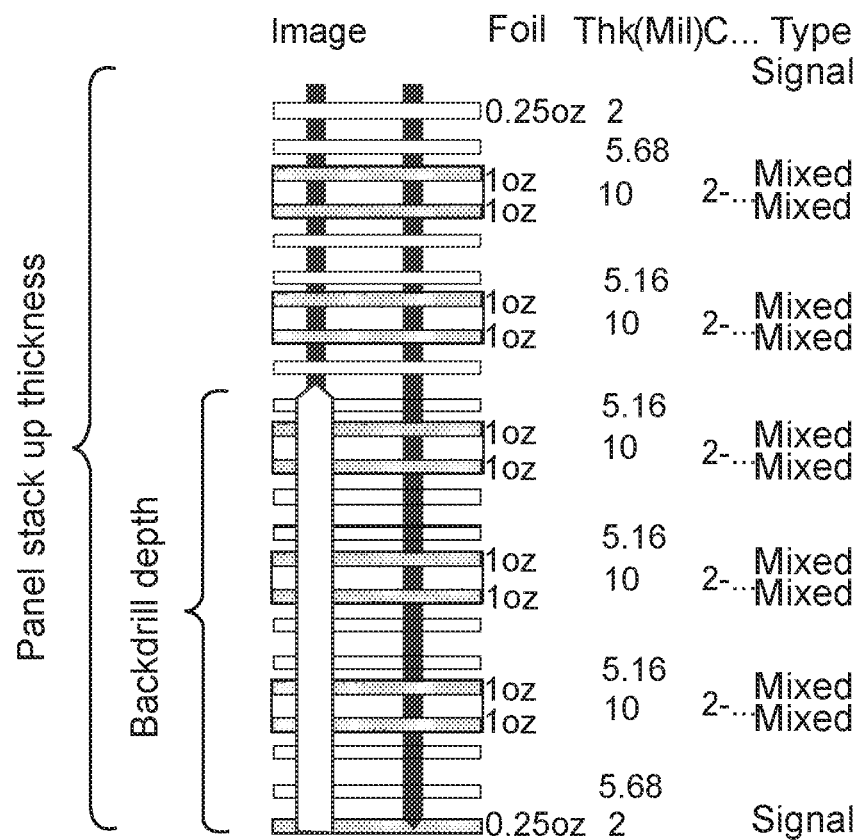
FIG. 5 illustrates a board theoretical thickness and theoretical back drill depth.
Figure 6:
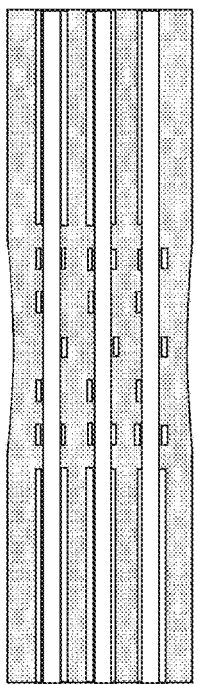
FIG. 6 shows the thick area and the thin area in a PCB board due to copper density variation.
Figure 7:
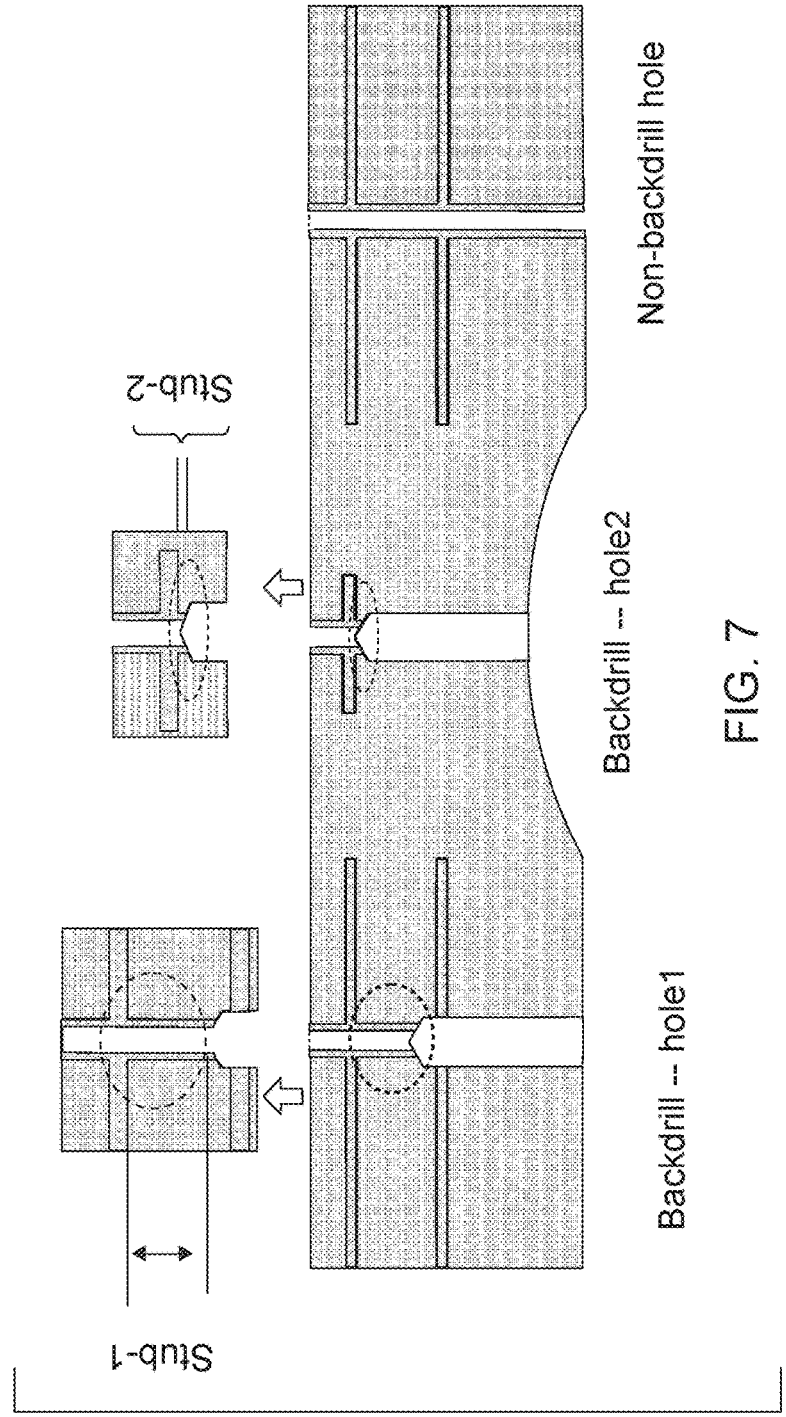
FIG. 7 shows that PCBs' thick areas have longer back drill stub and thin areas have shorter back drill stub (as a result of traditional backdrill that leads to inconsistent back drill stub length)

FIG. 5 illustrates a board design with theoretical thickness (or stack up thickness) of 86 mil and theoretical back drill depth of 70 mil. FIG. 6 shows the thick area 5a and the thin area 5b in a PCB. FIG. 7 shows that PCBs' thick areas 5a having longer back drill length and the thin areas 5b having shorter back drill depth.

Figure 8A:
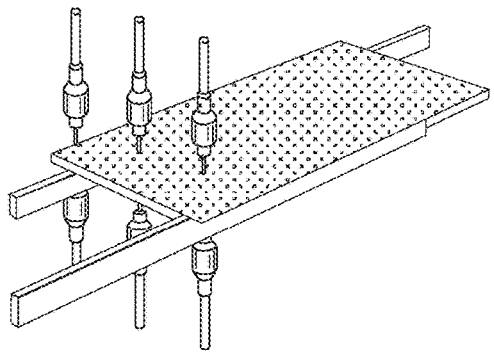
FIG. 8A illustrates the first step in the present invention in which each PCB actual thickness is mapped out by using a thickness measurement gauge.
Figure 8B:
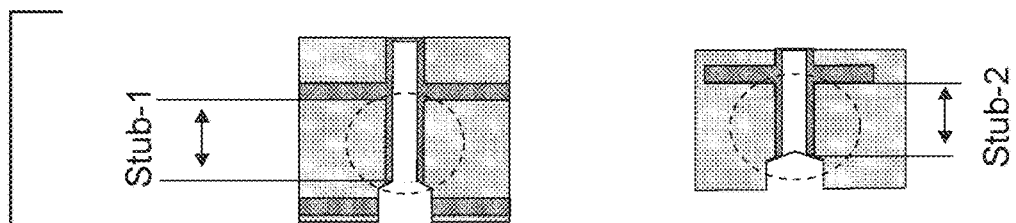
FIG. 8 B is a chart showing a PCB with a few measured thicknesses in the corners and in the center of the chart.
Figure 9:
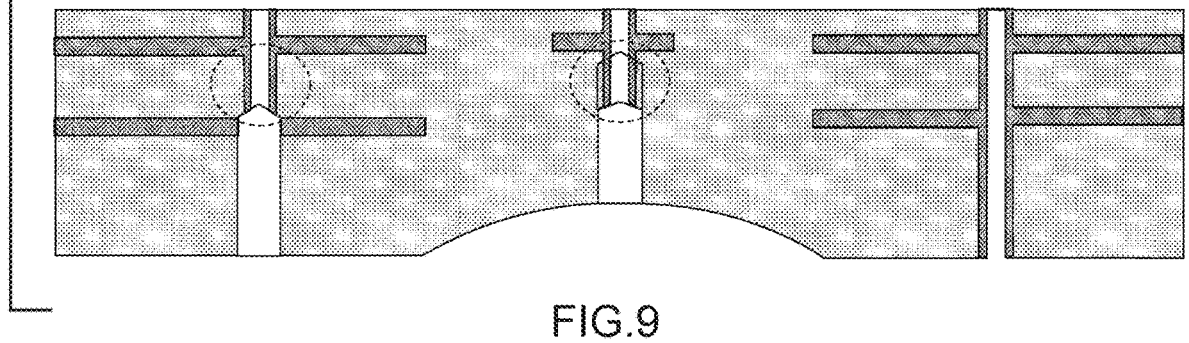
FIG. 9 shows a thin spot in a PCB with adjusted back drill depth that resulted in consistent back drill stub in accordance within the teachings of the present invention.
Figure 10:
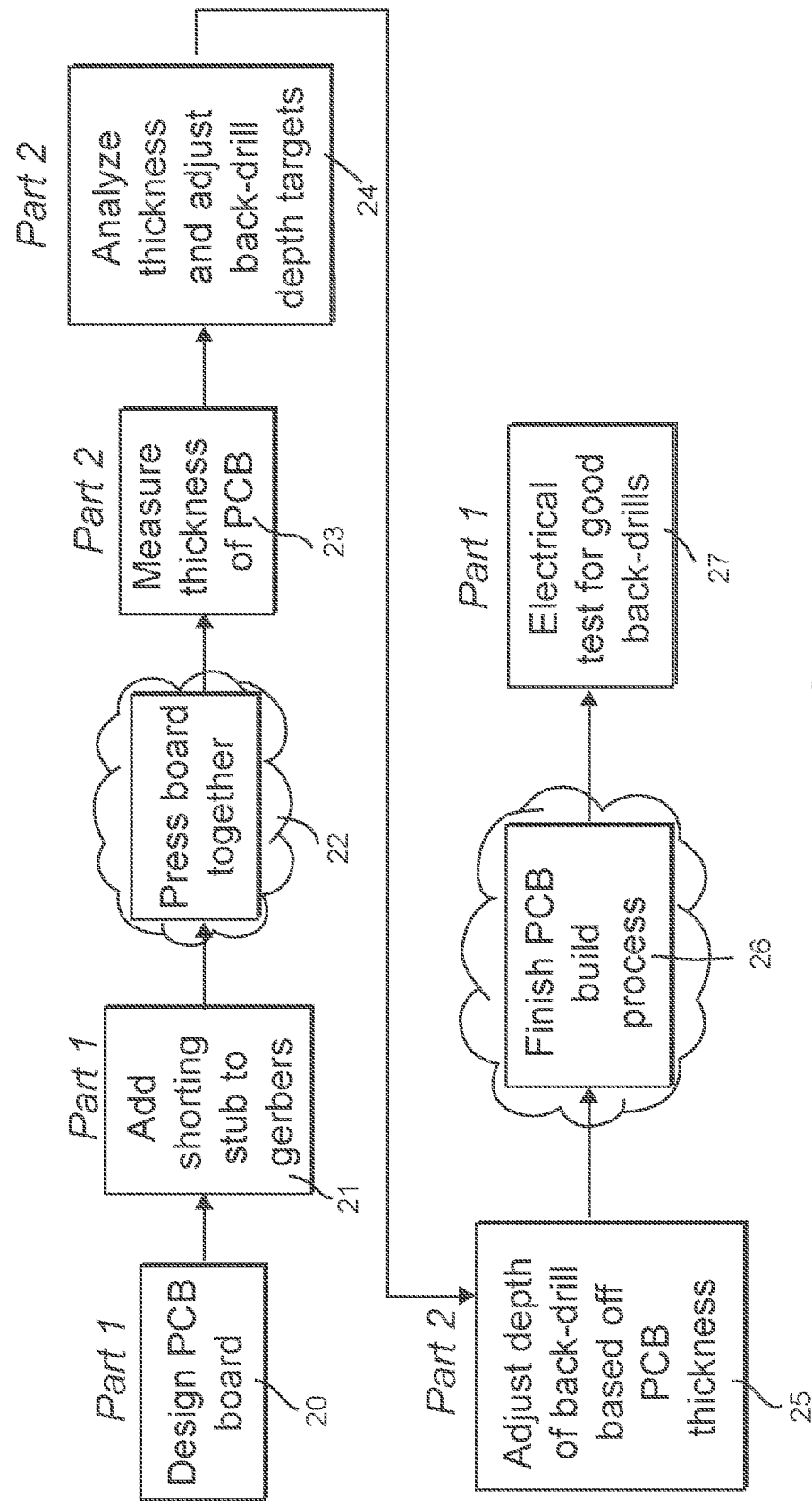
FIG. 10 illustrates the method of the present invention.

FIG. 8A illustrates the first step in the present invention in which each PCB 5 actual thickness is mapped out. FIG. 8 B is a chart showing a PCB 5 with a few measured thicknesses in the corners and in the center of the chart;

FIG. 9 shows a thin spot in a PCB 5 with an adjusted back drill 15 depth that resulted in consistent back drill stub length as in hole 6 in accordance with the teachings of the present invention;

FIG. 10 illustrates the method of the present invention with steps 20-21. In FIG. 10 detected poor or failed back-drills in printed circuit boards (PCBs) 5 are adjusted per steps 23-25 by selecting a designed or configured of one of each printed circuit board 5; measuring actual thickness of each PCB board 5.step 23, comparing measured actual thickness of each PCB board 5 with theoretical thickness of each PCB board 5; step 24, and adjusting the back drill 15 depth for in each area of the PCB board 5 for its theoretical thickness and percent variation 25 from the measured thickness to adjust correct the poor back drill 15.

The measured thickness is measured with a thickness measurement gauge. The comparison is accomplished by one of either a computer, microprocessor or other software stored device that includes tabulation of theoretical thicknesses for the PCBs 5 including, but not limited to, cloud storage, thumb wheel drives, hard discs, floppy discs, and back-up drives.

While presently preferred embodiments have been described for purposes of the disclosure, numerous changes in the arrangement of method steps and apparatus parts can be made by those skilled in the art. Such changes are encompassed within the spirit of the invention as defined by the appended claims

The invention claimed is:

1. A method for adjusting detected poor or failed back-drills in printed circuit boards (PCBs), comprising:
    selecting a designed or configured of one of each printed circuit board;
    measuring actual thickness of at least five different areas of each PCB;
    comparing measured actual thickness of each of said at least five different areas of each PCB with a theoretical thickness of each PCB; and
    adjusting a back drill depth for each of said at least five different areas of said PCB based on said measured actual thickness of each of said at least five different areas of said PCB such that a back drill depth for each said area is configured to produce a functional back drill within said area.

2. The method according to claim 1 wherein said measured actual thickness is measured with a thickness measurement gauge.

3. The method according to claim 1 wherein said comparing is accomplished by one of either a computer, microprocessor or other software stored device including cloud storage, thumb wheel drives, hard discs, floppy discs, and back-up drives that includes tabulation of said theoretical thicknesses for said PCBs.

4. The method according to claim 1 wherein said PCB is configured for high speed applications in a range of 30 to 100 GHZ.

5. The method according to claim 1 wherein said PCB is configured for high speed applications in a range of 30 to 70 GHZ.

6. The method according to claim 1 wherein said back drill depth for each area of said PCB for its theoretical thickness and percent variation from said measured actual thickness to adjust said poor back drill producing said back drill depth of approximately a same length 0.1 mil to 2 mil for each said PCB having a tolerance range of ±1 mil.

7. The method according to claim 1 wherein said back drill depth for in each area of said PCB for its theoretical thickness and percent variation from said measured actual thickness to adjust said poor or failed back drill producing said back drill depth of approximately a same length 3 mil to 5 mil for each said PCB having a tolerance range of ±3 mil.

8. A method for detecting and adjusting poor or failed back-drills in printed circuit boards (PCBs), comprising:
    selecting a designed or configured printed circuit board;
    adding a shorting trace or a short to ground connection to a signal via where said connection is cut by a back-drill in said printed circuit board (PCB), wherein said connection is formed on a ground layer closest to a signal layer comprising the signal; and
    electrically testing said signal via to determine if said shorting trace electrically connects the signal via to ground which indicates that said back-drill has failed or is poor resulting in a lower bandwidth transmission line;
    measuring actual thickness of each said PCB;
    comparing measured actual thickness of each said PCB with theoretical thickness of each said PCB; and
    adjusting a depth of a back drill in each area of said PCB for the PCB's theoretical thickness and percent variation from said measured actual thickness to adjust said poor or failed back drill producing a back drill stub of approximately consistent length for each said PCB having a tight tolerance for high speed signal applications.

9. The method according to claim 8 wherein said adjusting produces said back drill stub of approximately a same length 0.1 mil to 2 mil for each said PCB having a tolerance range of ±1 mil for high speed signal applications in a range of 30 to 100 GHZ.

10. The method according to claim 8 wherein said shorting trace has said back drill stub length of approximately 10 mils plus or minus 5 mil back-drill.

11. The method according to claim 8 wherein said shorting trace is located on one or more ground layers of said PCB only.

12. The method according to claim 8 wherein said shorting trace is located on one or more ground or power or signal layers of said PCB.

13. The method according to claim 8 wherein said shorting trace is located on any one or more layers of said PCB including multiple layers or a layer closest to a signal trace approximately 5 mils past said signal trace within back-drill tolerances.

14. The method according to claim 8 wherein said shorting trace is located on either ground layers only, on ground or power layers, or on any layer of said PCB including multiple layers or a layer closest to a signal trace within back-drill tolerances of plus or minus 3 mils.

15. The method according to claim 13 further comprising:
    selecting one or more design files for said PCB in a computer system;
    updating all back drill vias in said one or more selected design files to create an intentional short to ground for said PCB from said one or more selected design files comparing the PCB files before and after said intentional short to verify correct functionality; and
    comparing error checking output files to expected errors generated within said computer system wherein a shorting of a signal via to ground will create an error that will be detected by a detection software in said computer system to ensure identification of unrelated errors beyond the expected errors from said intentional short.

16. The method according to claim 15 wherein said computer system further includes said detection software comprising a design rule check (DRC) that checks for nets that are shorted together and other error checking and includes adding the shorting trace at all back-drill locations and adjusting a layer said shorting trace is on by a tolerance of the back-drill and a depth of the back-drill or the layer of the signal trace.

17. The method according to claim 16 wherein once the shorting traces are added the DRC errors will be displayed or shown by said computer system and said back-drill shorting trace and DRC flags are predicted and screened out so that DRC flags for legitimate errors are caught and fixed.

18. The method according to claim 8 wherein said measured actual thickness is measured with a thickness measurement gauge.

19. The method according to claim 8 wherein said comparing is accomplished by one of either a computer, microprocessor or other software stored device that includes tabulation of theoretical thicknesses for said PCBs.

* * * * *